United States Patent
Matsuura et al.

[11] Patent Number: 6,156,707
[45] Date of Patent: Dec. 5, 2000

[54] METHOD OF MANUFACTURING SUPERCONDUCTING MICROWAVE COMPONENT SUBSTRATE

[75] Inventors: Takashi Matsuura; Kenjiro Higaki; Hideo Itozaki, all of Hyogo, Japan

[73] Assignee: Sumitomo Electric Industries, Ltd., Osaka, Japan

[21] Appl. No.: 08/383,713

[22] Filed: Feb. 3, 1995

Related U.S. Application Data

[63] Continuation of application No. 08/253,602, Jun. 3, 1994, abandoned, which is a continuation of application No. 07/885,871, May 20, 1992, abandoned.

[51] Int. Cl.$^7$ .................................................. C23C 14/34
[52] U.S. Cl. .......................... 505/470; 505/475; 505/501; 204/192.24
[58] Field of Search .......................... 204/192.24; 505/1, 505/866, 470, 475, 501

[56] References Cited

U.S. PATENT DOCUMENTS

| | | | |
|---|---|---|---|
| 4,918,050 | 4/1990 | Dworsky | 505/866 X |
| 4,962,316 | 10/1990 | Jack | 505/866 X |
| 4,997,813 | 3/1991 | Higaki et al. | 204/192.24 X |
| 5,077,269 | 12/1991 | Sugihara et al. | 204/192.24 X |
| 5,114,906 | 5/1992 | Higaki et al. | 204/192.24 X |
| 5,140,004 | 8/1992 | Tanaka et al. | 204/192.24 X |

FOREIGN PATENT DOCUMENTS 0 435 765   3/1991   European Pat. Off. .

OTHER PUBLICATIONS

Hammond et al., "Epitaxial Tl$_2$CaBa$_2$Cu$_2$O$_8$ Thin ilms with Low 9.6 GHz Surface Resistance at High Power and Above 77 K", Applied Physics Letters, Aug. 20, 1990, vol. 57 No. 8, pp. 825–827

Tanaka, "High–Frequency Transmission through Bi–Sr–Ca–Cu–O Double–Sided Microstripline on a MgO Substrate", Japanese Journal of Applied Physics, Apr. 15, 1991 vol. 30, No. 4B, pp. L700–L702.

Withers, et al., –"High–Thdcl Superconducting Thin Films for Microwave Application", Solid State Technology, Aug. 1990, vol. 33 No. 8, pp. 83–87.

*Primary Examiner*—Nam Nguyen
*Attorney, Agent, or Firm*—Foley & Lardner

[57] ABSTRACT

A substrate for a superconducting microwave component is composed of a pair of oxide superconductor thin films formed on opposite surfaces of a dielectric substrate, respectively. After Tl-type oxide superconducting thin films are deposited the opposite surfaces of the dielectric substrate, respectively, am annealing is performed in a thallium atmosphere.

6 Claims, 1 Drawing Sheet

2a OXIDE SUPERCONDUCTING THIN FILM (Tl-Ba-Ca-Cu-O)
1 SUBSTRATE
2b OXIDE SUPERCONDUCTING THIN FILM (Tl-Ba-Ca-Cu-O)

METHOD OF MANUFACTURING SUPERCONDUCTING MICROWAVE COMPONENT SUBSTRATE

This application is a continuation of application Ser. No. 08/253,602, filed Jun. 3, 1994, abandoned, which is a continuation of Ser. No. 07/885,871, filed May 20,1992, abandoned.

BACKGROUND OF THE INVENTION

1. Field of the Invention

The present invention relates to a method for manufacturing a substrate for a superconducting microwave component, and more specifically to a novel method for manufacturing a substrate which can be suitably used in fabricating a microwave component having a conductor formed of an oxide superconducting thin film.

2. Description of Related Art

Electromagnetic waves called "microwaves" or "millimetric waves" having a wavelength in a range of a few tens centimeters to a few millimeters can be theoretically said to be merely a part of an electromagnetic wave spectrum, but have been considered from a viewpoint of an electric engineering to be a special independent field of the electromagnetic wave, since special and unique methods and devices have been developed for handling these electromagnetic waves.

On the other hand, in 1986, Bednorz and Müller reported $(La, Ba)_2CuO_4$ showing a superconducting state at a temperature of 30K. In 1987, Chu reported $YBa_2Cu_3O_y$ having a superconducting critical temperature on the order of 90 K, and in 1988, Maeda reported a so-call bismuth (Bi) type compound oxide superconducting material having a superconducting critical temperature exceeding 100 K. These compound oxide superconducting materials can obtain a superconducting with cooling using an inexpensive liquid nitrogen. As a result, possibility of actual application of the superconductor technology has become discussed and studied.

Phenomenon inherent to the superconduction can be advantageously utilized in various applications, and the microwave components are no exceptions. For example, a microstrip line has an attenuation coefficient that is attributable to a resistance component of the conductor. This attenuation coefficient attributable to the resistance component increases in proportion to a root of a frequency. On the other hand, the dielectric loss increases in proportion to increase of the frequency. However, the loss of a recent microstrip line particularly in the range of not greater than 10GHz is almost attributable to the resistance of the conductor, since the dielectric materials have been recently improved. Therefore, if the resistance of the conductor in the strip line can be reduced, it is possible to greatly elevate the performance of the microstrip line.

As well known, the microstrip line can be used as a simple signal transmission line. However, if a suitable patterning is applied, the microstrip line can be used as other microwave components including an inductor, a filter, a resonator, and a delayed line. Therefore, improvement of the microstrip line will directly result in improvement of characteristics of these microwave components. Under this circumstance, various microwave devices having a conductor line or lines formed of oxide superconductors have been proposed.

Here, a microwave transmission line for guiding the electromagnetic waves in the microwave band is generally formed of a pair of conductors separated from each other by a dielectric, one of the pair of conductors being grounded.

For example, a substrate which can be suitably used in fabricating the above mentioned microwave transmission line is formed of a dielectric substrate as an underlying substrate and a pair of oxide superconductor thin films formed on an upper surface and a lower surface of said underlying substrate, respectively. If this substrate is given or available, various superconduction microwave components can be easily fabricated by suitably patterning one of the pair of oxide superconductor thin films formed on the upper and lower surfaces of said underlying substrate, respectively.

However, a problem has been encountered in forming the above mentioned substrate for the microwave component, by a process of depositing an oxide superconductor thin film on one surface of a dielectric substrate, and thereafter depositing another oxide superconductor thin film on the other surface of the dielectric substrate.

The reason for this is as follows: First, the oxide superconductor thin film can be obtained only when a film of oxide superconductor material is deposited on a specific substrate under a specific deposition condition. Secondly, since oxygen contained in the oxide superconductor material is unstable, if the deposited oxide superconductor material is heated, the content of the oxygen will change. Therefore, in the process of sequentially depositing an oxide superconductor thin film on one or first surface of a dielectric substrate, and thereafter on the other or second surface of the dielectric substrate, the superconductor characteristics of the oxide superconductor thin film deposited on the first surface of a dielectric substrate is deteriorated or lost when the oxide superconductor thin film is deposited on the second surface of a dielectric substrate. Because of this, it has been considered to difficult to prepare a substrate for microwave component having superconductor thin film of uniform characteristics formed on opposite surfaces of the dielectric substrate.

SUMMARY OF THE INVENTION

Accordingly, it is an object of the present invention to provide a method for fabricating a substrate for superconduction microwave component, which method overcomes the problems of the above mentioned prior art.

Another object of the present invention is to provide a novel method for fabricating a substrate for superconduction microwave component having oxide superconductor material thin films which are formed on opposite surfaces of an underlying substrate and which can exert an effective superconducting characteristics The above and other objects of the present invention are achieved in accordance with the present invention by a method for manufacturing a substrate for a superconducting microwave component, the substrate being composed of an underlying substrate including a dielectric layer, and a pair of oxide superconductor thin films formed on an upper surface and a lower surface of the underlying substrate, respectively, the method including the steps of forming a Tl—Ba—Ca—Cu—O compound oxide thin film on one surface of the underlying substrate, forming another Tl—Ba—Ca—Cu—O compound oxide thin film on the other surface of the underlying substrate, and annealing in a thallium atmosphere the underlying substrate having a pair of surfaces coated with the Tl—Ba—Ca—Cu—O compound oxide thin films.

As seen from the above, the method in accordance with present invention for manufacturing a substrate for a superconducting microwave component is characterized in that after the Tl-type compound oxide thin films are formed on the opposite surfaces of the underlying substrate, respectively, the formed Tl-type compound oxide thin films are annealed in the thallium atmosphere.

As mentioned hereinbefore, in the conventional process of sequentially depositing an oxide superconductor thin film on a first surface of an underlying substrate, and thereafter on the second surface of the underlying substrate, the deterioration of the superconductor characteristics of the oxide superconductor thin film deposited on the first surface of the underlying substrate is inevitable in the step of depositing the oxide superconductor thin film on the second surface of the underlying substrate.

On the other hand, in the method in accordance with the present invention, since the Tl-type compound oxide is used as the oxide superconductor material, it is possible to perform the process for finally restoring the characteristics of the pair of oxide superconductor thin film.

Namely, it is possible to deposit the Tl-type oxide superconducting thin films at an extremely low substrate temperature on the order of a room temperature. Therefore, in the case that a oxide superconducting thin film is formed on one surface of the underlying substrate and thereafter on the other surface of the underlying substrate, the deterioration of the firstly deposited thin film can be minimized.

In addition, if the deposited Tl-type oxide superconducting thin film is annealed in the thallium atmosphere, the quality of the film can be improved.

Thus, after the Tl-type oxide superconducting thin films are formed on the opposite surfaces of the underlying substrate, respectively, if the deposited Tl-type oxide superconducting thin films are annealed in the thallium atmosphere, not only the quality of the pair of Tl-type oxide superconducting thin films can be improved, but also the film characteristics of the pair of thin films can be brought into substantially the same.

The annealing is preferably conducted in the oxygen atmosphere containing not less than 5 mol % of thallium. If the content of the thallium is less than 5 mol %, an effective improvement of the film quality due to the annealing cannot be obtained. In this connection, it is considered that when the thallium is contained in the annealing oxygen atmosphere, the thallium exists in the form of thallium oxide.

In addition, the annealing temperature is preferred to be in the range of 850° C. to 900° C. inclusive. If the annealing temperature is lower than this temperature range, a valid annealing effect cannot be obtained. If the annealing temperature is higher than this temperature range, the film quality of the thin film is rather deteriorated due to the annealing heat.

Furthermore, the annealing period of time is preferred to be in the range of one hour to three hours inclusive. If the annealing time is shorter than this range, a valid annealing effect cannot be obtained. If the annealing time is longer than this range, the film quality of the thin film is rather deteriorated due to the annealing heat.

The underlying substrate should be formed of a dielectric material which has a small dielectric loss and which makes it possible to deposit the oxide superconductor thin film thereon in a good condition. $LaAlO_3$, $NdGaO_3$ and MgO can be exemplified. In addition, it is further preferred to use a substrate obtained by forming, on opposite surfaces of a dielectric plate such as a sapphire and $SiO_2$ having an extremely small dielectric loss, a buffer layer which makes it possible to deposit the oxide superconductor material in a good condition.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Figure 1:
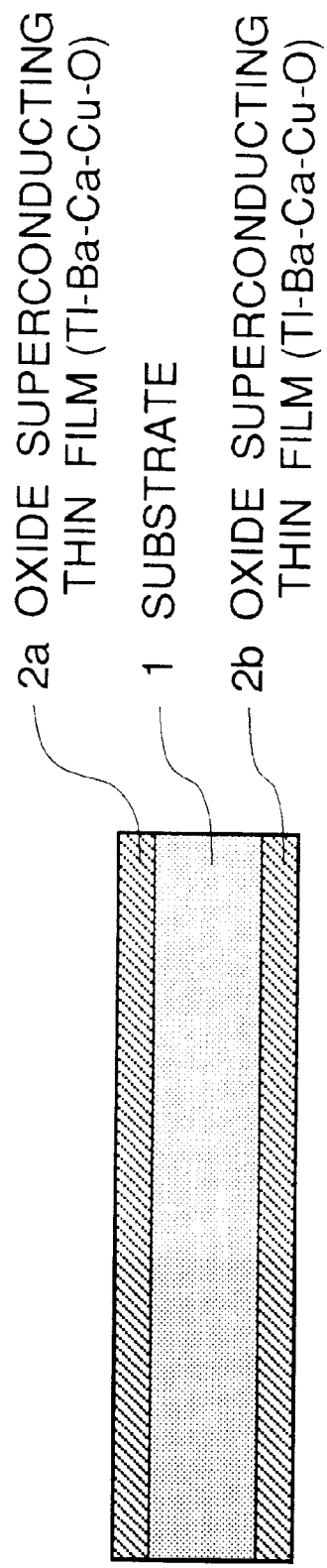
FIG. 1 is a diagrammatic sectional view illustrating a basic construction of the substrate for the superconducting microwave component.

Referring to FIG. 1, the substrate for the superconducting microwave component includes a dielectric underlying substrate 1 and a pair of oxide superconducting thin films 2a and 2b deposited on opposite surfaces of the underlying substrate 1, respectively.

EXAMPLE 1

The superconducting microwave component substrate having the above mentioned construction was manufactured in accordance with the method of the present invention.

A $LaAlO_3$ substrate having a thickness of 0.5 mm, a width of 15 mm and a length of 15 mm was used as the dielectric substrate. An oxide superconducting thin film was deposited by a sputtering. The deposition condition was as follows:

Target: $Tl_2Ba_2Ca_{2.5}Cu_3O_y$,

Sputtering gas: Ar containing 20 mol % of $O_2$

Gas pressure: 50 mTorr

Substrate Temperature: 50° C.

Film thickness: 10000 Å

A pair of oxide superconducting thin films were continuously deposited on opposite surfaces of the dielectric substrate, respectively, in the same deposition chamber without taking the substrate out of the deposition chamber.

Thereafter, the substrate having the opposite surfaces coated with the oxide superconducting thin films, respectively was annealed in a thallium atmosphere. The annealing condition was as follows:

Atmosphere: $O_2$ gas containing 10 mol % of Tl

Gas pressure: 1 atm

Annealing Temperature: 870° C.

Annealing Time: 1 hour

In the thus formed substrate for microwave component, the characteristics of the oxide superconductor thin film formed on each of the opposite surfaces was measured. The result of the measurement is shown in the following:

|  | Critical temperature (K.) | Critical current density (A/cm$^2$) |
| --- | --- | --- |
| First surface (upper) | 104 | 1.4 × 10$^5$ |
| Second surface (lower) | 102 | 1.2 × 10$^5$ |

As seen from the above, in the substrate for microwave component fabricated in accordance with the method of the present invention, the oxide superconductor thin films respectively formed on the opposite surfaces of the underlying substrate have a substantially uniform superconduction characteristics. Incidentally, the critical current density was measured at 77 K.

COMPARATIVE EXAMPLE 1

For comparison, another substrate for microwave component was manufactured by using the same dielectric substrate as that of Example 1, and using an Y—Ba—Cu—O type compound oxide superconducting thin film material. The Y—Ba—Cu—O type compound oxide superconducting thin film was deposited by a sputtering. The deposition condition was as follows:

Target: $Y_1Ba_2Cu_3O_y$
Sputtering gas: Ar containing 20 mol % of $O_2$
Gas pressure: 0.5 Torr
Substrate Temperature: 620° C.
Film thickness: 4000 Å

In the thus formed comparative example of the substrate for microwave component, the characteristics of the oxide superconductor thin film formed on each of the opposite surfaces was measured. The result of the measurement is shown in the following:

|  | Critical temperature (K.) | Critical current density (A/cm$^2$) |
| --- | --- | --- |
| First surface (upper) | 83 | 1 × 10$^5$ |
| Second surface (lower) | 60 | — |

As seen from the above, in the comparative example, the oxide superconductor thin film formed on the first surface of the underlying substrate was remarkably deteriorated in characteristics. Incidentally, the critical current density was measured at 77 K.

COMPARATIVE EXAMPLE 2

For comparison, a substrate for microwave component was manufactured in the same process as that of Example 1, excluding the annealing condition.

Thereafter, the substrate thus manufactured was annealed in a thallium atmosphere under the following annealing condition:

Atmosphere: $O_2$ gas containing 10 mol % of Tl
Gas pressure: 1 atm
Annealing Temperature: 950° C.
Annealing Time: 2 hours In the thus formed substrate for microwave component, the characteristics of the oxide superconductor thin film formed on each of the opposite surfaces was measured. The critical current density was measured at 77 K. The result of the measurement is shown in the following:

|  | Critical temperature (K.) | Critical current density (A/cm$^2$) |
| --- | --- | --- |
| First surface (upper) | 70 | — |
| Second surface (lower) | 75 | — |

The above mentioned deterioration of the characteristics is considered to be attributable to that the thallium contained in the oxide superconductor thin films is evaporated.

COMPARATIVE EXAMPLE 3

For comparison, a substrate for microwave component was manufactured in the same process as that of Example 1, excluding the annealing condition.

Thereafter, the substrate thus manufactured was annealed in a thallium atmosphere under the following annealing condition:

Atmosphere: $O_2$ gas containing 10 mol % of Tl
Gas pressure: 1 atm
Annealing Temperature: 800° C.
Annealing Time: 2 hours In the thus formed substrate for microwave component, the characteristics of the oxide superconductor thin film formed on each of the opposite surfaces was measured. The critical current density was measured at 77 K. The result of the measurement is shown in the following:

|  | Critical temperature (K.) | Critical current density (A/cm$^2$) |
| --- | --- | --- |
| First surface (upper) | 55 | — |
| Second surface (lower) | 57 | — |

The above mentioned deterioration of the characteristics is considered to be attributable to that the oxide superconductor thin films are not sufficiently crystallized.

COMPARATIVE EXAMPLE 4

For comparison, a substrate for microwave component was manufactured in the same process as that of Example 1, excluding the annealing condition.

Thereafter, the substrate thus manufactured was annealed in a thallium atmosphere under the following annealing condition:

Atmosphere: $O_2$ gas containing 10 mol % of Tl
Gas pressure: 1 atm
Annealing Temperature: 900° C.
Annealing Time: 5 hours In the thus formed substrate for microwave component, the characteristics of the oxide superconductor thin film formed on each of the opposite surfaces was measured. The critical current density was measured at 77 K. The result of the measurement is shown in the following:

|  | Critical temperature (K.) | Critical current density (A/cm$^2$) |
| --- | --- | --- |
| First surface (upper) | 76 | — |
| Second surface (lower) | 72 | — |

The above mentioned deterioration of the characteristics is considered to be attributable to that the thallium contained in the oxide superconductor thin films is evaporated.

COMPARATIVE EXAMPLE 5

For comparison, a substrate for microwave component was manufactured in the same process as that of Example 1, excluding the annealing condition.

Thereafter, the substrate thus manufactured was annealed in a thallium atmosphere under the following annealing condition:

Atmosphere: $O_2$ gas containing 10 mol % of Tl
Gas pressure: 1 atm
Annealing Temperature: 900° C.
Annealing Time: 0.5 hours In the thus formed substrate for microwave component, the characteristics of the oxide superconductor thin film formed on each of the opposite surfaces was measured. The critical current density was measured at 77 K. The result of the measurement is shown in the following:

|  | Critical temperature (K.) | Critical current density (A/cm$^2$) |
|---|---|---|
| First surface (upper) | 45 | — |
| Second surface (lower) | 42 | — |

The above mentioned deterioration of the characteristics is considered to be attributable to that the oxide superconductor thin films are not sufficiently crystallized.

COMPARATIVE EXAMPLE 6

For comparison, a substrate for microwave component was manufactured in the same process as that of Example 1, excluding the annealing condition.

Thereafter, the substrate thus manufactured was annealed in a thallium atmosphere under the following annealing condition:

Atmosphere: $O_2$ gas containing 4 mol % of Tl
Gas pressure: 1 atm
Annealing Temperature: 870° C.
Annealing Time: 1 hour In the thus formed substrate for microwave component, the characteristics of the oxide superconductor thin film formed on each of the opposite surfaces was measured. The critical current density was measured at 77 K. The result of the measurement is shown in the following:

|  | Critical temperature (K.) | Critical current density (A/cm$^2$) |
|---|---|---|
| First surface (upper) | 65 | — |
| Second surface (lower) | 68 | — |

The above mentioned deterioration of the characteristics is considered to be attributable to that the thallium contained in the oxide superconductor thin films is evaporated.

As seen from the above, according to the method of the present invention, it is possible to manufacture a superconducting microwave component substrate having a pair of good oxide superconducting thin films which are formed on opposite surfaces of a single dielectric substrate and which are substantially the same in superconducting characteristics.

Therefore, the substrate manufactured in accordance with the method of the present invention can be used for fabricating various microwave components, by suitably patterning one of the pair of good oxide superconducting thin films. The microwave components thus obtained has a conductor formed of the superconductor, and therefore, has a small propagation loss and a wide application frequency band.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a substrate for a superconducting microwave component, the substrate being composed of an underlying dielectric substrate and a pair of oxide superconductor thin films formed on a pair of opposite planar surfaces of said underlying dielectric substrate, respectively, the method including the steps of:

forming a first Tl—Ba—Ca—Cu—O compound oxide thin film on a first planar surface of said underlying dielectric substrate, forming a second Tl—Ba—Ca—Cu—O compound oxide thin film on a second planar surface of said underlying dielectric substrate, and annealing said underlying dielectric substrate coated with said first and second Tl—Ba—Ca—Cu—O compound oxide thin films in an oxygen atmosphere that contains not less than 5 mol % of thallium at a temperature in the range of 850° C. to 900° C. inclusive for a time in the range of one to three hours inclusive, to produce substantially uniform superconductive characteristics in said first and second Tl—Ba—Ca—Cu—O compound oxide thin films.

2. A method claimed in claim 1 wherein said underlying substrate is formed of a material selected from the group consisting of $LaAlO_3$, $NdGaO_3$ and MgO.

3. A method claimed in claim 1 wherein said underlying substrate is formed of a material selected from the group consisting of a sapphire and $SiO_2$, said underlying substrate having on opposite surfaces thereof a buffer layer which makes it possible to deposit the oxide superconductor material in a good condition.

4. A method claimed in claim 1, additionally comprising a step of patterning one of said compound oxide superconductor films to produce a microwave component.

5. A method for manufacturing a substrate for a superconducting microwave component, the substrate being composed of an underlying dielectric substrate and a pair of oxide superconductor thin films formed on a pair of opposite planar surfaces of said underlying dielectric substrate, respectively, the method including the steps of:

forming a first Tl—Ba—Ca—Cu—O compound oxide thin film on a first planar surface of a underlying dielectric substrate of $LaAlO_3$, forming a second Tl—Ba—Ca—Cu—O compound oxide thin film on a second planar surface of said underlying dielectric substrate opposite to said first planar surface, and annealing said underlying dielectric substrate coated with said first and second Tl—Ba—Ca—Cu—O compound oxide thin films in an oxygen atmosphere that contains not less than 5 mol % of thallium at a temperature in the range of 850° C. to 900° C. inclusive for a time in the range of one to three hours inclusive, to produce substantially the same critical temperature and substantially the same critical current density in said first and second Tl—Ba—Ca—Cu—O compound oxide thin films.

6. A method claimed in claim 5, additionally comprising a step of patterning one of said compound oxide superconductor films to produce a microwave component.

* * * * *